(12) United States Patent
Jo et al.

(10) Patent No.: US 8,441,835 B2
(45) Date of Patent: May 14, 2013

(54) INTERFACE CONTROL FOR IMPROVED SWITCHING IN RRAM

(75) Inventors: Sung Hyun Jo, Sunnyvale, CA (US); Hagop Nazarian, San Jose, CA (US); Wei Lu, Ann Arbor, MI (US)

(73) Assignee: Crossbar, Inc., Menlo Park, CA (US)

( * ) Notice: Subject to any disclaimer, the term of this patent is extended or adjusted under 35 U.S.C. 154(b) by 0 days.

(21) Appl. No.: 12/814,410

(22) Filed: Jun. 11, 2010

(65) Prior Publication Data
US 2011/0305064 A1    Dec. 15, 2011

(51) Int. Cl.
*G11C 11/00* (2006.01)

(52) U.S. Cl.
USPC .......................................... 365/148; 365/158

(58) Field of Classification Search .................. 365/148, 365/158
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,714,416 A | 2/1998 | Eichman et al. | |
| 5,751,012 A | 5/1998 | Wolstenholme et al. | |
| 5,840,608 A | 11/1998 | Chang | |
| 5,970,332 A | 10/1999 | Pruijmboom et al. | |
| 5,998,244 A | 12/1999 | Wolstenholme et al. | |
| 6,128,214 A | 10/2000 | Kuekes et al. | |
| 6,143,642 A | 11/2000 | Sur, Jr. et al. | |
| 6,259,116 B1 | 7/2001 | Shannon | |
| 6,291,836 B1 | 9/2001 | Kramer et al. | |
| 6,436,765 B1 | 8/2002 | Liou et al. | |

(Continued)

FOREIGN PATENT DOCUMENTS

| | | |
|---|---|---|
| KR | 1020110014248 A | 2/2011 |
| WO | WO 2009/005699 A1 | 1/2009 |

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Anthan Tran
(74) *Attorney, Agent, or Firm* — Ogawa P.C.

(57) ABSTRACT

A memory device has a crossbar array including a first array of first electrodes extending along a first direction. A second array of second electrodes extends along a second direction. A non-crystalline silicon structure provided between the first electrode and the second electrode at an intersection defined by the first array and the second array. The non-crystalline silicon structure has a first layer having a first defect density and a second layer having a second defect density different from the first defect density. Each intersection of the first array and the second array defines a two-terminal memory cell.

19 Claims, 9 Drawing Sheets

U.S. PATENT DOCUMENTS

| | | |
|---|---|---|
| 6,436,818 B1 | 8/2002 | Hu et al. |
| 6,492,694 B2 | 12/2002 | Noble et al. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,365,411 B2 | 4/2008 | Campbell |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,237,146 B2 | 8/2012 | Kreupl et al. |
| 2004/0026682 A1 | 2/2004 | Jiang |
| 2004/0194340 A1 | 10/2004 | Kobayashi |
| 2005/0020510 A1 | 1/2005 | Benedict |
| 2005/0029587 A1 | 2/2005 | Harshfield |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0105284 A1 | 5/2007 | Herner |
| 2007/0105390 A1 | 5/2007 | Oh |
| 2007/0205510 A1 | 9/2007 | Lavoie et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0206931 A1 | 8/2008 | Breuil et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0102290 A1* | 4/2010 | Lu et al. ............................ 257/4 |
| 2010/0157651 A1 | 6/2010 | Kumar et al. |
| 2010/0157710 A1 | 6/2010 | Lambertson et al. |
| 2010/0176368 A1 | 7/2010 | Ko et al. |
| 2010/0219510 A1 | 9/2010 | Scheuerlein et al. |
| 2010/0321095 A1 | 12/2010 | Mikawa et al. |
| 2011/0133149 A1 | 6/2011 | Sonehara |
| 2011/0155991 A1 | 6/2011 | Chen |
| 2011/0198557 A1 | 8/2011 | Rajendran et al. |
| 2011/0212616 A1 | 9/2011 | Seidel et al. |
| 2011/0227028 A1 | 9/2011 | Sekar et al. |
| 2011/0284814 A1* | 11/2011 | Zhang ............................... 257/2 |
| 2011/0317470 A1 | 12/2011 | Lu et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0104351 A1 | 5/2012 | Wei et al. |
| 2012/0145984 A1 | 6/2012 | Rabkin et al. |
| 2012/0155146 A1 | 6/2012 | Ueda et al. |
| 2012/0235112 A1 | 9/2012 | Huo et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", NATURE, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9, No. 1, Department of Electrical Engineering and Computer Science, The University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters,2010, pp. 1297-1301, pubs.acs.org/NanoLett, pp. A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

M. J. Rose et al., "Amorphous Silicon Analogue Memory Devices", Journal of Non-Crystalline Solids, 1989, pp. 168-170, vol. 115, Elsevier Science Publishers B.V., North-Holland.

A. Moopenn et al., "Programmable Synaptic Devices for Electronic Neural Nets", Control and Computers, 1990, pp. 37-41, vol. 18 No. 2.

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.

J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.

J. Hajto et al., "Electronic Switching in Amorphous-Semiconductor Thin Films", Chapter 14, Sep. 30, 1992, pp. 640-701.

J. Hajto et al., "Analogue memory and ballistic electron effects in metal-amorphous silicon structures", Philosophical Magazine B, 1991, pp. 349-369, vol. 63 No. 1, Taylor & Francis Ltd.

A. J. Holmes et al., "Design of Analogue Synapse Circuits using Non-Volatile a-Si:H Memory Devices", Proceedings of ISCAS, 1994, pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.

D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin $SiO_2$ films", Applied Physics Letters, 1989, pp. 128-130, vol. 55.

Herve Marand et al., MESc. 5025 lecture notes: Chapter 7. Diffusion, University of Vermont, http://www.files.chem.vt.edu/chem-dept/marand/MEScchap6-1c.pdf.

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

Sung Hyun Jo, "Nanoscale Memristive Devices for Memory and Logic Applications", Ph. D dissertation, University of Michigan, 2010.

Office Action for U.S. Appl. No. 12/894,098 dated Aug. 1, 2012.

Sung Hyun Jo et al., "CMOS Compatible Nanoscale Nonvolatile Resistance Switching Memory", Nano Letters, 2008, pp. 392-397, vol. 8, No. 2.

Office Action for U.S. Appl. No. 12/582,086 dated Apr. 19, 2011.

Office Action for U.S. Appl. No. 12/582,086 dated Sep. 6, 2011.

Notice of Allowance for U.S. Appl. No. 12/582,086 dated Oct. 21, 2011.

International Search Report for PCT/US2009/061249 filed on Oct. 20, 2009.

Written Opinion of the International Searching Authority for PCT/US2009/061249 filed on Oct. 20, 2009.

Notice of Allowance for U.S. Appl. No. 12/939,824 dated Jul. 24, 2012.

Office Action for Application No. EP 1100 5207.3 dated Aug. 8, 2012.

Office Action for U.S. Appl. No. 13/417,135 dated Oct. 9, 2012.

Office Action for U.S. Appl. No. 12/835,699 dated Aug. 24, 2011.

Notice of Allowance for U.S. Appl. No. 12/835,699 dated Feburary 6, 2012.

Office Action for U.S. Appl. No. 12/833,898 dated Apr. 5, 2012.

European Search Report for Application No. EP 1100 5207.3 of Oct. 12, 2011.

Notice of Allowance for U.S. Appl. No. 12/833,898 dated May 30, 2012.

Notice of Allowance for U.S. Appl. No. 12/939,824 dated May 11, 2012.

Office Action for U.S. Appl. No. 12/913,719 dated Feb. 17, 2011.

Office Action for U.S. Appl. No. 12/913,719 dated Jul. 22, 2011.

Notice of Allowance for U.S. Appl. No. 12/913,719 dated Mar. 12, 2012.

Notice of Allowance for U.S. Appl. No. 12/940,920 dated Oct. 5, 2011.

Office Action for U.S. Appl. No. 13/314,513 dated Mar. 27, 2012.

Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.

Office Action for U.S. Appl. No. 13/149,653 dated Apr. 25, 2012.

International Search Report for PCT/US2011/045124 filed on Jul. 22, 2011.

Written Opinion of the International Searching Authority for PCT/US2011/045124 filed on Jul. 22, 2011.

Peng-Heng Chang et al, "Aluminum spiking at contact windows in Al/Ti-W/Si", Appl. Phys. Lett., Jan. 25, 1988, pp. 272-274, vol. 52, No. 4, American Institute of Physics.

J. Del Alamo et al, "Operating limits of Al-alloyed high-low junction for BSF solar cells", Solid-State Electronics, 1981, pp. 415-420, vol. 24, Pergamon Press Ltd., Great Britain.

Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.

Notice of Allowance for U.S. Appl. No. 12/894,087 dated Oct. 25, 2012.

Notice of Allowance for U.S. Appl. No. 13/149,807 dated Oct. 29, 2012.

Notice of Allowance for U.S. Appl. No. 12/861,666 dated Nov. 14, 2012.

Office Action for U.S. Appl. No. 13/156,232, dated Nov. 26, 2012.

Notice of Allowance for U.S. Appl. No. 13/290,024 dated Nov. 28, 2012.

Corrected Notice of Allowance for U.S. Appl. No. 12/861,666 dated Jan. 11, 2013.

Supplemental Notice of Allowance for U.S. Appl. No. 12/894,087 dated Jan. 11, 2013.

Notice of Allowance for U.S. Appl. No. 13/532,019 dated Nov. 14, 2012.

Office Action for U.S. Appl. No. 13/149,653 dated Nov. 20, 2012.

Office Action of U.S. Appl. No. 13/436,714 dated Dec. 7, 2012.

Notice of Allowance for U.S. Appl. No. 13/314,513 dated Jan. 24, 2013.

Notice of Allowance for U.S. Appl. No. 13/118,258, dated Feb. 6, 2013.

International Search Report and Written Opinion for PCT/US2012/040242, filed May 31, 2012.

Office Action for U.S. Appl. No. 13/174,264 dated Mar. 6, 2013.

Office Action for U.S. Appl. No. 13/679,976, dated Mar. 6, 2013.

Notice of Allowance for U.S. Appl. No. 12/894,098, dated Mar. 15, 2013.

Office Action for U.S. Appl. No. 13/465,188, dated Mar. 19, 2013.

Office Action for U.S. Appl. No. 12/861,432 dated Mar. 29, 2013.

* cited by examiner

INTERFACE CONTROL FOR IMPROVED SWITCHING IN RRAM

CROSS-REFERENCES TO RELATED APPLICATIONS

NOT APPLICABLE

BACKGROUND OF THE INVENTION

The present invention relates to solid state resistive devices used for memory storage.

Resistive random-access memories (RRAMs) have generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. Resistance switching has also been explained by field assisted diffusion of ions in $TiO_2$ and amorphous silicon (a-Si) films.

In the case of a-Si structures, voltage-induced diffusion of metal ions into the silicon leads to the formation of conductive filaments that reduce the resistance of the a-Si structure. These filaments remain after the biasing voltage is removed, thereby giving the device its non-volatile characteristic, and they can be removed by reverse flow of the ions back toward the metal electrode under the motive force of a reverse polarity applied voltage.

Resistive devices formed by an a-Si structure provided between two metal electrodes have been shown to exhibit this controllable resistive characteristic. However, such devices typically have micron sized filaments which may prevent them from being scaled down to the sub-100 nanometer range. Such devices may also require high forming voltages that can lead to device damage and can limit production yields.

BRIEF SUMMARY OF THE INVENTION

The present invention relates to solid state resistive devices used for memory storage.

In an embodiment, a memory device has a crossbar array including a first array of first electrodes extending along a first direction. A second array of second electrodes extends along a second direction. An amorphous or other non-crystalline silicon structure provided between the first electrode and the second electrode at an intersection defined by the first array and the second array. The non-crystalline silicon structure has a first layer having a first defect density and a second layer having a second defect density different from the first defect density. Each intersection of the first array and the second array defines a two-terminal memory cell.

In another embodiment, a resistive memory device includes a first electrode; a second electrode; a non-crystalline silicon structure provided between the first electrode and the second electrode, the non-crystalline silicon structure having a first layer having a first defect density and a second layer having a second defect density different from the first defect density. The first electrode, second electrode and non-crystalline silicon structure define a two-terminal resistive memory cell. The non-crystalline silicon structure includes amorphous silicon. The first electrode includes silver, the non-crystalline silicon structure includes amorphous silicon, and the second electrode includes p-type polysilicon.

In yet another embodiment, a method for fabricating a resistive memory device providing a substrate; forming a bottom electrode over the substrate; forming a switching medium over the bottom electrode, the switching medium defining a first region proximate to the bottom electrode and a second region distal from the bottom electrode, the first region having a higher defect density than the second region in order to facilitate a filament formation in the first region; and forming a top electrode over the switching medium, the top electrode configured to provide at least part of metal particles needed to form the filament in the first region.

In yet another embodiment, a method for fabricating a resistive memory device providing a substrate; forming a bottom electrode over the substrate; forming a switching medium including a p-type polysilicon over the bottom electrode, the switching medium defining a first region proximate to the bottom electrode and a second region distal from the bottom electrode, the first region having a higher defect density than the second region in order to facilitate a filament formation in the first region; forming a top electrode over the switching medium, the top electrode configured to provide at least part of metal particles needed to form the filament in the first region; forming a metal film of no more than 5 nm over the p-type polysilicon; and annealing the metal film. The switching medium is formed over the p-type polysilicon after the metal film has been annealed, so that an interface between the switching medium and the p-type polysilicon is provided with at least part of metal particles needed to form the filament in the first region.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

Figure 1:
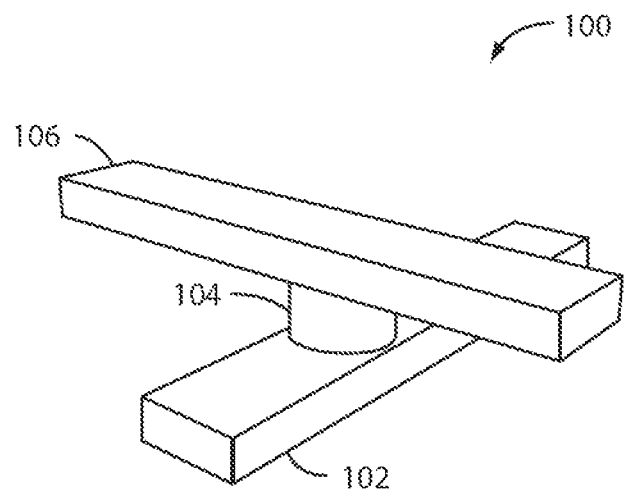
FIG. 1 illustrates a non-volatile solid state resistive device including a bottom electrode, a switching medium, and a top electrode according an embodiment of the present invention.

FIG. 1 illustrates a non-volatile solid state resistive device 100 including a bottom electrode 102, a switching medium 104, and a top electrode 106 according an embodiment of the present invention. Switching medium 104 exhibits a resistance that can be selectively set to various values, and reset, using appropriate control circuitry. Device 100 is a two-terminal nanoscale resistive random-access memory (RRAM) in the present embodiment. As will be appreciated by one skilled in art, device 100 may be used also as a programmable variable capacitor or other types of devices.

RRAM is a two terminal device having a switching medium provided between top and bottom electrodes. The resistance of the switching medium can be controlled by applying electrical signal to the electrodes. The electrical signal may be current-based or voltage-based. As used herein, the term "RRAM" or "resistive memory device" refers to a memory device that uses a switching medium whose resistance can be controlled by applying electrical signal without ferroelectricity, magnetization and phase change of the switching medium.

In the present embodiment, device 100 is amorphous-silicon-based RRAM and uses amorphous silicon as switching medium 104. The resistance of the switching medium 104 changes according to formation or retrieval of a conductive filament inside the a-Si switching medium according to voltage applied. Top electrode 106 is a conductive layer containing silver (Ag) and acts as the source of filament-forming ions in the a-Si structure. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co). Bottom electrode 104 is a boron-doped or other p-type polysilicon electrode 130 that is in contact with a lower end face of the a-Si structure.

Figure 2:
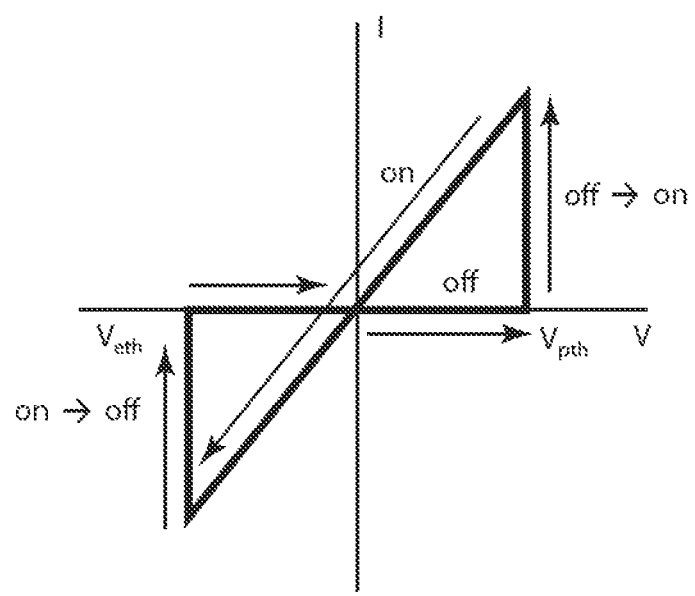
FIG. 2 illustrates resistance switching characteristics of device according to an embodiment of the present invention.

FIG. 2 illustrates resistance switching characteristics of device 100 according to an embodiment of the present invention. The switching medium displays a bipolar switching mechanism. The resistance of the switching medium changes depending on the polarity and magnitude of the signal applied to the switching medium via the top and bottom electrodes. The device is changed into ON-state (low resistance state) when a positive voltage equal to or greater than a program threshold voltage (or program voltage) $V_{pth}$ is applied. In an embodiment, the program voltage ranges between 2 volts to 4 volts depending on the materials used for the switching medium and the top electrode. The device is switched back to OFF-state (high resistance state) when a negative voltage of equal or greater magnitude than erase threshold voltage (or erase voltage) $V_{eth}$ is applied. In an embodiment, the erase voltage ranges from −2 volts to −4 volts. The device state is not affected if the bias applied is between two threshold voltages $V_{pth}$ and $V_{eth}$, which enables the low-voltage read process. Once device 100 is set to a specific resistance state, the device retains the information for a certain period (or retention time) without electrical power.

Figure 3A:
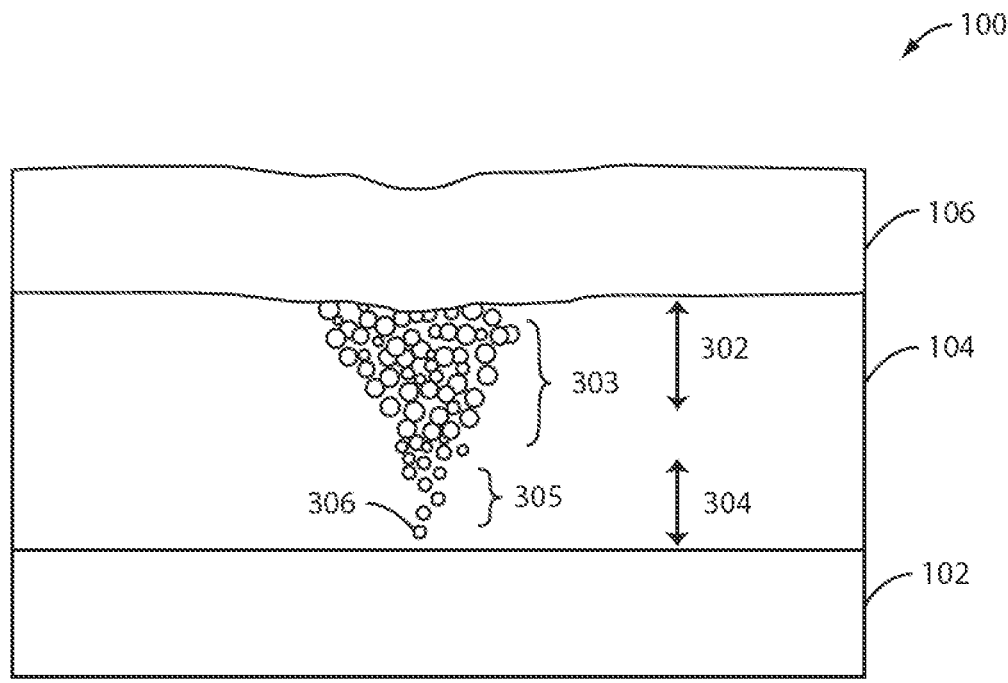
FIG. 3A illustrates a two-terminal device that is placed in an ON state by applying a program voltage $V_{pth}$ to the top electrode.
Figure 3B:
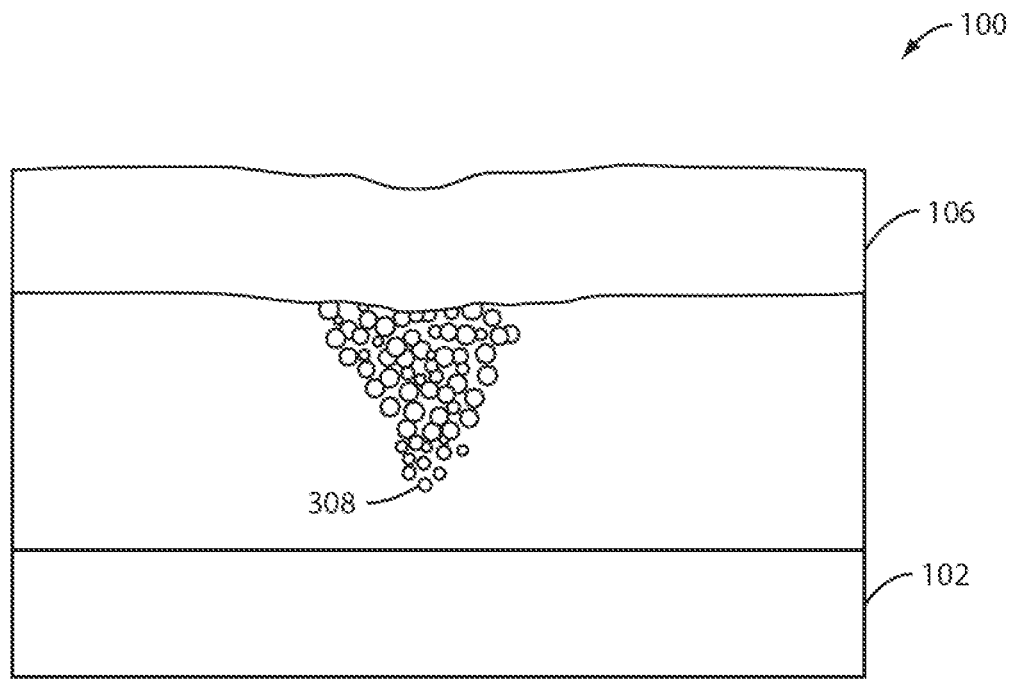
FIG. 3B illustrates a two-terminal device that is placed in an OFF state by applying an erase voltage $V_{eth}$ to the top electrode.

FIGS. 3A and 3B illustrate a switching mechanism of device 100 during ON and OFF states according to an embodiment of the present invention. The switching in an a-Si medium 104 is based on formation and retrieval of a nanoscale conductive filament (or a plurality of filaments) in a filament region in the a-Si medium according to the program and the erase voltages applied to the electrodes of device 100.

FIG. 3A illustrates device 100 that is placed in an ON state by applying a program voltage $V_{pth}$ to the top electrode. Switching medium 104 made of a-Si is provided between bottom electrode 102 and top electrode 106. An upper portion of the switching medium includes a metallic region (or conductive path) 302 that extends from the top electrode to about 10 nm above the bottom electrode. Metallic region 302 is formed during an electroforming process when a slightly larger voltage (e.g., 3~5 volts), than a subsequent program voltage is applied to the top electrode. This relatively large voltage causes the electric field induced diffusion of the metal ions from the top electrode toward the bottom electrode, thereby forming a continuous conductive path 303. A lower portion of the switching medium defines a filament region 304 wherein a filament 305 is formed when a program voltage $V_{pth}$ is applied after the electroforming process. In certain implementations, the conductive path 303 and the filament 305 can be also formed together in a single step, e.g., during the electroforming process. The filament comprises a series of metal particles that are trapped in defect sites in a lower portion of the switching medium when a program voltage applied provides sufficient activation energy to push a number of metal ions from metallic region 302 toward the bottom electrode.

Filament 305 is believed to be comprised of a collection of metal particles that are separated from each other by the non-conducting switching medium and does not define a continuous conductive path, unlike the path 303 in the metallic region. Filament 305 extends about 2-10 nm depending on implementation. The conduction mechanism in the ON state is electrons tunneling through the metal particles in the filament. The device resistance is dominated by the tunneling resistance between a metal particle 306 and the bottom electrode. Metal particle 306 is the metal particle in the filament region that is closest to the bottom electrode and is the last metal particle in the filament region in the ON state.

FIG. 3B illustrates device 100 that is placed in an OFF state by applying an erase voltage $V_{eth}$ to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a greater distance than the metal particle 306 during the ON state. This increased distance between the metal particle 308 and the bottom electrodes places the device 100 in a high resistance state compared to the ON state. In an embodiment, the resistance ratio between the ON/OFF states ranges from 10E3 to 10E7. Device 100 behaves like a resistor in the ON state and a capacitor in the OFF state (i.e., the switching medium does not conduct current in any meaningful amount and behaves as a dielectric in the OFF state). In an implementation, the resistance is 10E5 Ohm in the ON state and 10E10Ohm in the OFF state. In another implementation, the resistance is 10E4 Ohm in the ON state and 10E9 Ohm in the OFF state. In yet another implementation, the resistance is at least 10E7 Ohm in the OFF state.

In an embodiment, device 100 exhibits controllable ON-state current flow of 10 nA-10 mA and endurance of greater 10E6. Device 100, however, exhibits relatively low retention time of 6 years at room temperature. One reason for the low retention time for device 100 is believed to be the presence of only a small number of metal particles that are trapped in the defect sites in filament region 304. With a limited number of metal particles in the filament region, dislodging only a few metal particles can significantly increase the resistance of device 100 and cause the device to switch from ON state to OFF state. In order to increase the retention time, device 100 should be provided with a greater number of metal particles in the filament region by increasing the number of defect sites in the filament region to trap the metal particles therein.

Device 100, however, has p-type polysilicon as bottom electrode 102 and amorphous silicon as switching medium 104. Since the a-Si switching medium 104 is formed on polysilicon bottom electrode 102, the amorphous silicon formed thereon is substantially homogenous and have relatively few defect sites at the interface between a-Si and p-type polysilicon. Fewer defect sites at the interface results in fewer metal particles that could be trapped in the filament region. Accordingly, even a minor variance in the defect site formation can result in a significant change in percentage of available defect sites needed to trap the metal particles in the filament region. This can cause the retention time to fluctuate greatly from a device to a device and from one programmed state to another. Accordingly, it would be desirable to provide the filament region of the switching medium with a higher defect density in order to increase the retention time and make the retention time more predictable. The defect site formation, however, needs to be controllable so that too many defect sites are not created in the filament region which would seriously diminish the endurance of device 400, as explained in U.S. patent application Ser. No. 12/582,086, filed on Oct. 20, 2009, which is incorporated by reference in its entirety.

Figure 4:
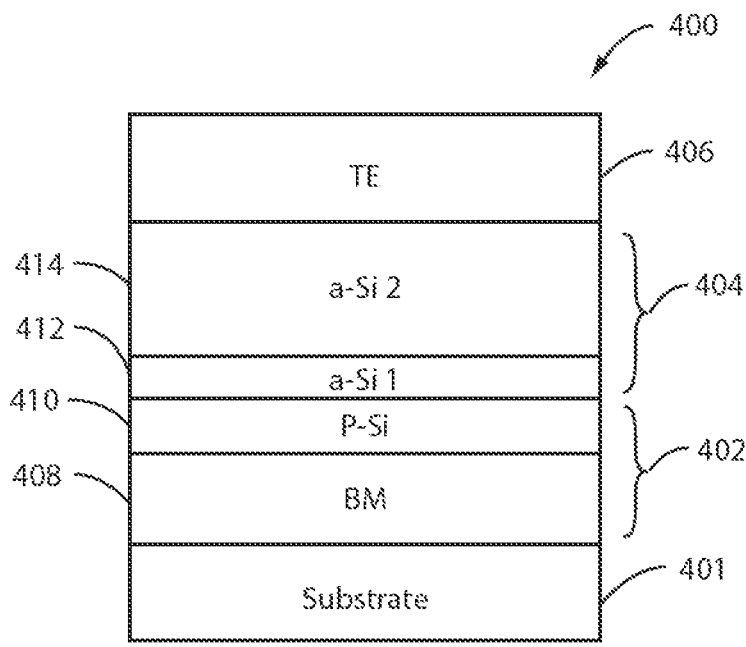
FIG. 4 illustrates a nanoscale non-volatile solid state resistive device having a dual switching layer according to an embodiment of the present invention.

FIG. 4 illustrates a nanoscale non-volatile solid state resistive device 400 having a dual switching layer according to an embodiment of the present invention. Device 400 is a two-terminal memory in the present embodiment. Device 400 includes a bottom electrode 402, a dual switching layer 404, and a top electrode 406. Device 400 is an RRAM in the present embodiment, but may be other types of device in other embodiments. Device 400 is formed over a semiconductor substrate 401. The semiconductor substrate may be a silicon substrate or a compound substrate of a III-V or II-VI type. In an embodiment, the substrate is not made of semiconductor material, e.g., made of plastic. Although the present embodiment illustrates switching layer 404 as having two different types of layers, the switching layer 404 may have more than two different types of layers in other embodiments or one type of layer having a defect density gradient.

As used herein, the term "nanoscale" or "nanostructure" refers to a structure having at least one dimension in the nanoscale range; for example, structures having a diameter or plural cross-sectional dimensions within the general range of 0.1 to 200 nanometers. This includes structures having all three spatial dimensions in the nanoscale; for example, a cylindrical nanocolumn or nanopillar having a length that is on the same order as its nanoscale diameter. Nanostructures can include the various nanoscale structures known to those skilled in the art; for example, nanotubes, nanowires, nanorods, nanocolumns, nanopillars, nanoparticles, and nanofibers.

In the present embodiment, bottom electrode 402 includes a bottom metal layer 408 formed on a substrate (not shown) and a p-type polysilicon layer 410 formed on the bottom metal layer. The p-type polysilicon layer has a thickness of 10~30 nm, and the bottom metal layer has a thickness of about 150 nm according to one implement. The thicknesses of these layers may vary depending on implementation. In the present embodiment, p-type polysilicon layer 408 is a boron-doped polysilicon, and bottom metal layer 410 is made of metal, e.g., tungsten, aluminum or copper, or an alloy thereof. In an implementation, the bottom metal is replaced with non-metal material that has a higher conductivity than the p-type polysilicon layer.

P-type polysilicon 410 facilitates the defect site formation in the a-Si switching medium to be controllable by enabling the tuning of the amorphous silicon deposition on the p-type polysilicon, so that the defect density in the filament region does not become too high. When a non-silicon-based material, e.g., Nickel or other metal, is used as a platform whereon the amorphous silicon is formed, the inventors have found that the filament formation was difficult to control due to the excess number of defect sites formed at the a-Si/metal interface. Furthermore, a-Si can react with the bottom metal electrode during the a-Si deposition, giving a-Si and metal alloy (silicide) at the interface. Accordingly, in addition to serving as an electrode, p-type polysilicon 410 serves as a platform that enables defect formation in the a-Si switching layer to be controllable.

In the present embodiment, switching layer 404 includes amorphous silicon and exhibits a resistance that can be selectively set to various values, and reset, using appropriate control circuitry. In other embodiments, switching layer 404 includes other non-crystalline silicon structures, such as amorphous polysilicon (sometimes called nanocrystalline silicon, an amorphous phase that includes small grains of crystalline silicon). As used herein, the term "non-crystalline silicon" refers to amorphous silicon or amorphous polysilicon that exhibits controllable resistance, a combination thereof, or the like.

Switching layer 404 includes a first a-Si structure 412 having a thickness of 2-15 nm and a second a-Si structure 414 having a thickness of 20-80 nm. The thicknesses of these amorphous silicon structures vary depending on the device size and configuration. In an embodiment, the first and second a-Si structures are films wherein the width and length are substantially greater than the thickness. Alternatively, the first and second a-Si structures may be pillars wherein the vertical dimension is more pronounced than the dimensions of width and length.

In the present embodiment, the first and second amorphous silicon layer (or structures) 412 and 414 have different defect densities. The first a-Si structure contacting the p-type polysilicon layer is made to have a higher defect density than the second a-Si structure in order to increase the number of metal particles trapped in the defect sites in filament region 304 of device 400 and increase the retention time of the device. In an embodiment, switching layer 404 includes yet another amorphous silicon structure having a different defect density than the first and second amorphous silicon structures. In another embodiment, switching layer 404 is made to have a defect density gradient at least in its lower portion proximate the p-type polysilicon.

Top electrode 406 contains silver (Ag) as the source of filament-forming metal ions in the switching medium. In an embodiment, top electrode 406 is a Ag film with a thickness of 150 nm. In other embodiments, the top electrode can be a stacked structure. For example, a Ag layer of about 50 nm is deposited on top of a-Si and another metal (e.g., TiN/W) of about 100 nm can be deposited on top of the Ag layer. The thickness may vary depending on the device size and implementation. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co) or a metal stack (or stacks).

Figure 5A:
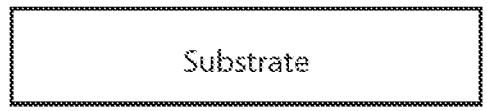
FIGS. 5A-5E illustrate a process for forming a two-terminal memory device having a dual switching layer according to an embodiment of the present invention.

FIGS. 5A-5E illustrate a process for forming device 400 having a dual switching layer 404 according to an embodiment of the present invention. A substrate 502 whereon a plurality of devices 400 is to be defined is provided (FIG. 5A). The substrate is a prime grade silicon substrate in the present embodiment. In other embodiments, other semiconductor materials such as III-V and II-VI type semiconductor compounds may be used as the substrate. Device 400 may be formed as part of a front-end process or a back-end process depending on implementation. Accordingly, substrate 502 may include one or more layers of material formed and patterned thereon when the substrate is provided for the present process.

Figure 5B:
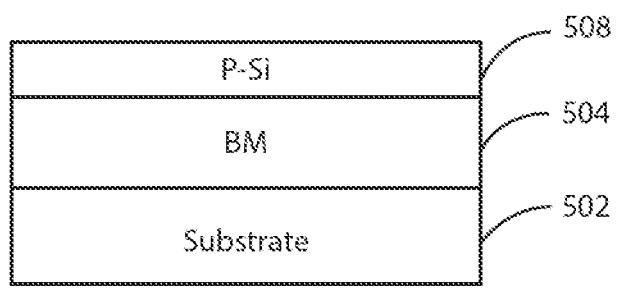

A bottom metal layer 504 is formed over substrate 502 (FIG. 5B). One purpose of the bottom metal is to minimize the resistance of the bottom electrode to be formed. The bottom metal may not be needed in certain implementations. The bottom metal can be gold (Au), nickel (Ni), aluminum (Al), chromium (Cr), iron (Fe), manganese (Mn), tungsten (W), vanadium (V), cobalt (Co), platinum (Pt), titanium nitride (TiN) or a stack (or stacks) of metals. The bottom metal preferably should comprise metal having a high voltage threshold for ion migration (e.g., higher than that of the metal used for the top electrode).

A polysilicon layer 506 is formed over bottom metal layer 504 to define the bottom electrode having the bottom metal and the polysilicon layer (FIG. 5B). The polysilicon is a p-type and has high doping concentration of 10E17~10E21/cm$^3$ in the present embodiment. Polysilicon 506 may be doped with acceptors such as Boron (B) or Aluminum (Al). P-type polysilicon 506 may be formed using a chemical vapor deposition (CVD) technique or a low pressure chemical vapor deposition (LPCVD) technique. Alternatively, other deposition techniques may also be used, e.g., atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (ALCVD) or atomic layer epitaxy, hybrid physical-chemical vapor deposition (HPCVD), hot wire CVD (HWCVD), direct liquid injection CVD (DLICVD) and vapor phase epitaxy (VPE).

Figure 5C:
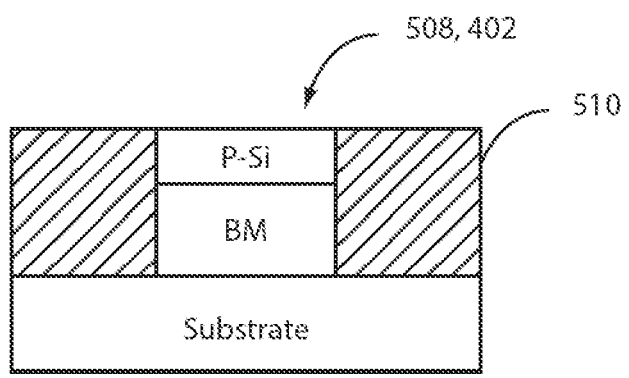

Referring to FIG. 5C, bottom metal 504 and p-type polysilicon 506 are patterned to obtain a bottom electrode 508 (corresponding to bottom electrode 402 of device 400) extending along a direction (e.g., horizontal direction). Although not shown, a plurality of bottom electrodes 510 extending along the first direction in parallel is formed at this step. An insulating layer 510 is formed over the patterned bottom electrode and then planarized to expose the p-type polysilicon. Insulating layer 510 is silicon dioxide in an embodiment.

Figure 5D:
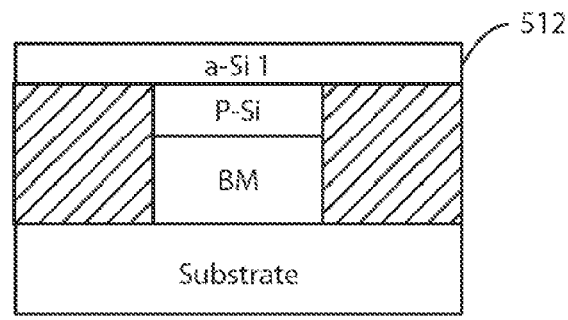

In the present embodiment, a first amorphous silicon layer 512 having relatively high defect density is formed on the p-type polysilicon to a thickness of 2-15 nm (FIG. 5D). The first a-Si layer defines a filament region of device 400 wherein a filament will be formed when a program voltage is applied to place the device in ON state. The high defect density of first a-Si layer 512 allows more metal particles to be trapped in the filament region, thereby increasing the retention time of the device.

In the present embodiment, the process parameters for deposition are used to control the defect density of the first a-Si layer. In an implementation, first a-Si layer 512 is deposited at a relatively high temperature in the range of about 400-450° C. using PECVD to increase the number of defect sites formed in the first a-Si layer. The following is exemplary process parameters used for PECVD: a mixture of SiH4 (45 sccm) and He (500 sccm), a deposition rate of 80 nm per minute, temperature of 400-450° C., and chamber pressure of 600 mTorr. In another implementation, first a-Si layer 512 is deposited at a temperature of about 450~600° C. in a LPCVD system. The exemplary process parameters for LPCVD include: SiH4 (80 sccm), a deposition rate of 2.8 nm per minute, temperature of 585° C. and pressure of 100 mTorr.

In addition to the deposition temperature, the amount of hydrogen added during the deposition process can be adjusted to control the defect density in the first a-Si layer. Typically adding more hydrogen reduces the defect density. Hydrogen can be added by adding silane ($Si_3H_4$, $SiH_4$) or hydrogen gas during the CVD process. Other process parameters may be tuned to obtain the desired defect density in first a-Si layer 512.

In addition to PECVD and LCVD, the first a-Si layer may be formed using other deposition techniques, e.g., atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (ALCVD) or atomic layer epitaxy, hybrid physical-chemical vapor deposition (HPCVD), hot wire CVD (HWCVD), direct liquid injection CVD (DLICVD) and vapor phase epitaxy (VPE).

In an embodiment, the first a-Si layer is formed by performing a physical vapor deposition (PVD) at a room temperature. Typically, amorphous silicon deposited by PVD methods has few applications as a device since the defect level tends to be too high making it difficult to obtain the desired electrical or optical properties. However, PVD methods may be used to form the first a-Si layer in certain embodiments of the present invention since the increased defect density may be controlled to obtain better retention time for device 400.

Figure 5E:
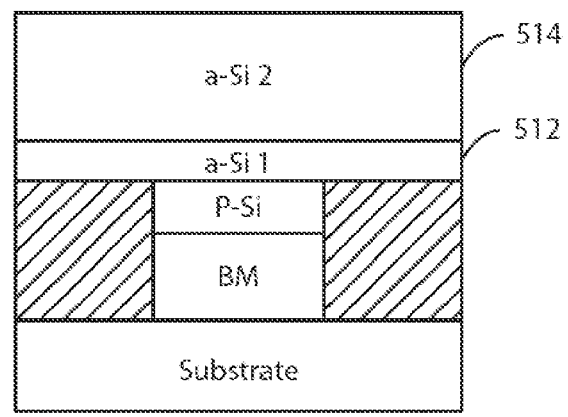

Referring to FIG. 5E, a second amorphous silicon layer 514 having a lower defect density than the first a-Si layer is formed on the first a-Si layer to a thickness of 20-80 nm according to the present embodiment. The second amorphous silicon layer defines a region wherein a metallic region of device 400 will be formed when an electroforming process is performed.

In an embodiment, second a-Si layer 514 is deposited at a different temperature than that used to form the first a-Si layer. In an implementation, the second a-Si layer is formed using PECVD with the following process parameters: a mixture of SiH4 (45 sccm) and He (500 sccm), a deposition rate of 80 nm per minute, temperature of 260-350° C., and chamber pressure of 600 mTorr. In addition to deposition temperature, the amount of hydrogen added during the deposition can be increased compared to that used to form the first a-Si to reduce the defect density in the second a-Si layer. Other process parameters may be tuned to obtain second a-Si layer 514 having a lower defect density than the first a-Si layer.

In addition to PECVD, the second a-Si layer may be formed using other deposition techniques, e.g., low pressure CVD (LPCVD), atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (ALCVD) or atomic layer epitaxy, hybrid physical-chemical vapor deposition (HPCVD), hot wire CVD (HWCVD), direct liquid injection CVD (DLICVD), vapor phase epitaxy (VPE) and PVD.

Figure 5F:
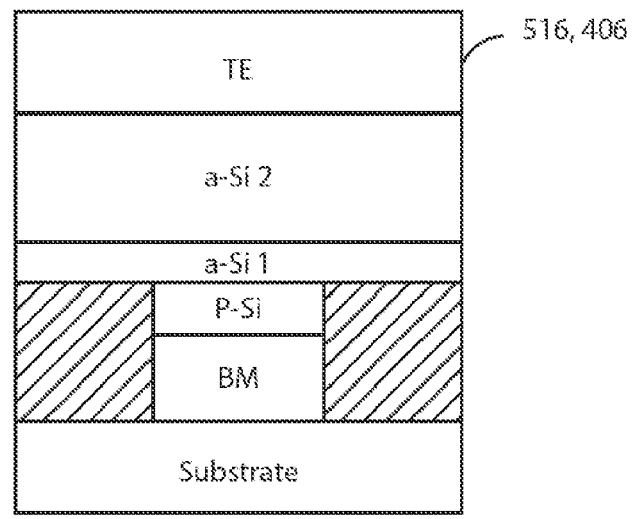

Referring to FIG. 5F, a filament-forming-ion-supplying metal layer 516 is formed over the second a-Si layer. In the present embodiment, metal layer 516 includes silver. In other embodiments, metal layer 516 may include gold (Au), nickel (Ni), aluminum (Al), chromium (Cr), iron (Fe), manganese (Mn), tungsten (W), vanadium (V) and cobalt (Co). Palladium (Pd) may be deposited over silver layer 516 as a passivation layer. The metal layer is patterned to form top electrode 406 of device 400. The top electrode extends along a direction (e.g., a vertical direction) to form an angle with the bottom electrode, e.g., 90 degrees. Although not shown, device 400 includes a plurality of top electrodes 406 extending along a first direction and a plurality of bottom electrodes 402 extending along a second direction to define a plurality of intersections. Each intersection defines a two-terminal cell or device 400.

Figure 6A:
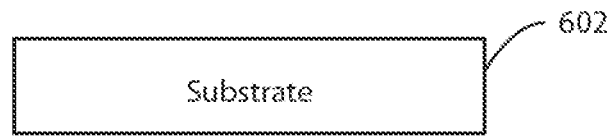
FIGS. 6A-6E illustrate a process for forming a two-terminal memory device having a dual switching layer according to another embodiment of the present invention.

FIGS. 6A-6E illustrate a process for forming a device (e.g., device 400) having a dual switching layer according to another embodiment of the present invention. A substrate 602 whereon a plurality of devices 400 is to be defined is provided (FIG. 6A). The substrate is a prime grade silicon substrate in the present embodiment. In other embodiments, other semiconductor materials such as III-V and II-VI type semiconductor compounds may be used as substrate 602. Device 400 may be formed as part of a front-end process or a back-end process depending on implementation. Accordingly, substrate 602 may include one or more layers of material formed and patterned thereon when the substrate is provided for the present process.

Figure 6B:
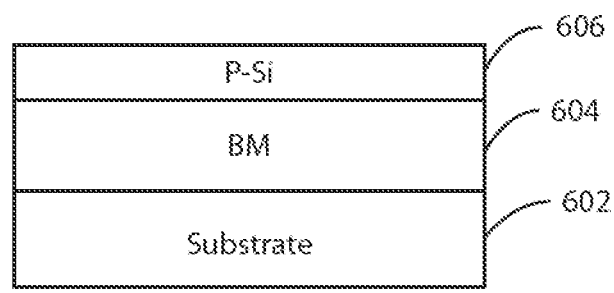

A bottom metal layer 604 is formed over substrate 602 (FIG. 6B). One purpose of the bottom metal is to minimize the resistance of the bottom electrode to be formed. The bottom metal may not be needed in certain implementations. The bottom metal can be gold (Au), nickel (Ni), aluminum (Al), chromium (Cr), iron (Fe), manganese (Mn), tungsten (W), vanadium (V), cobalt (Co), platinum (Pt), titanium nitride (TiN) or a stack (or stacks) of metals.

A polysilicon layer 606 is formed over bottom metal layer 604 to define the bottom electrode having the bottom metal and the polysilicon layer (FIG. 6B). The polysilicon is a p-type and has high doping concentration of $10E17 \sim 10E21/cm^3$ in the present embodiment. Polysilicon 606 may be doped with acceptors such as Boron (B) or Aluminum (Al). In an embodiment, polysilicon 606 is deposited to an initial thickness of 120 nm. The initial thickness may be reduced to about 65 nm due to the doping process since silicon may be consumed during the doping process. In some embodiments, the doping time is controlled to get a desired thickness of the p-type polysilicon. P-type polysilicon 606 may be formed using a chemical vapor deposition (CVD) technique or a low pressure chemical vapor deposition (LPCVD) technique. Alternatively, other deposition techniques may also be used, e.g., atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (ALCVD) or atomic layer epitaxy, hybrid physical-chemical vapor deposition (HPCVD), hot wire CVD (HWCVD), direct liquid injection CVD (DLICVD) and vapor phase epitaxy (VPE).

Figure 6C:
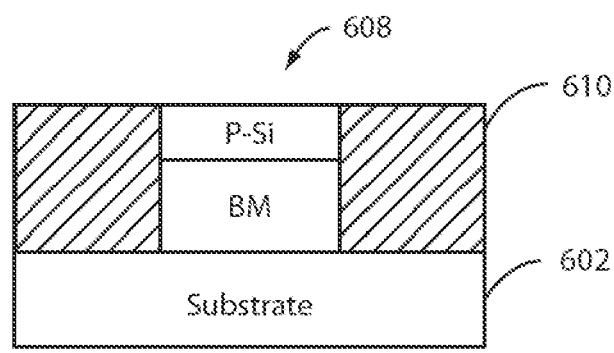

Referring to FIG. 6C, bottom metal 604 and p-type polysilicon 606 are patterned to obtain a bottom electrode 608 extending along a direction (e.g., horizontal direction). Although not shown, a plurality of bottom electrodes 608 extending along the first direction in parallel is formed at this step. An insulating layer 610 is formed over the patterned bottom electrode and then planarized to expose the p-type polysilicon. Insulating layer 610 is silicon dioxide in an embodiment.

Figure 6D:
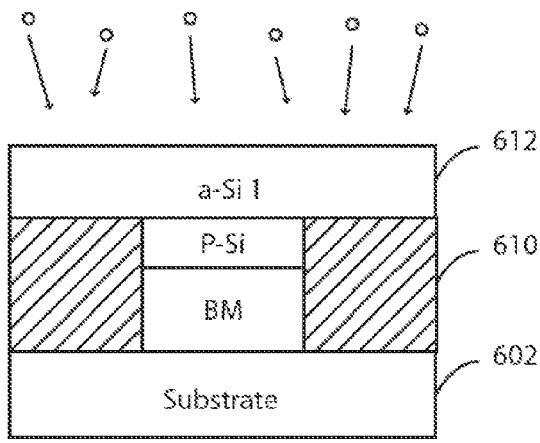

In the present embodiment, a first amorphous silicon layer 612 is formed on the p-type polysilicon to a thickness of 5-15 nm (FIG. 6D). The first a-Si layer defines a filament region of device 400 wherein a filament will be formed when a program voltage is applied to place the device in ON state. The first a-Si layer is physically etched to form defect sites thereon. The physical etch can be performed by sputter etch or ion milling. The defect density is controlled by adjusting the etch condition including the bias power, etch time, and other etch parameters.

Figure 6E:
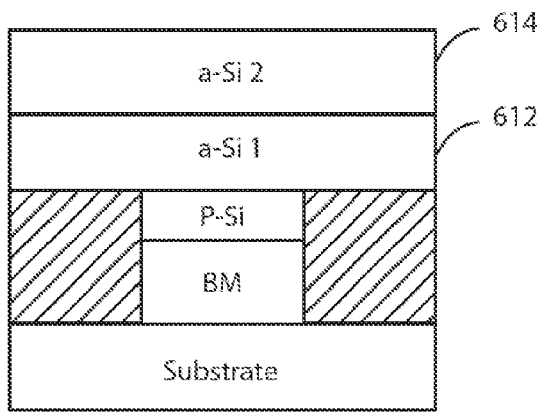

Referring to FIG. 6E, a second amorphous silicon layer 614 is formed on the first a-Si layer to a thickness of 20-80 nm according to an embodiment. The second amorphous silicon layer is formed using a PECVD, LPCVD, PVD, or other methods described above. Second a-Si layer 614 has a relatively less defect density than the first a-Si layer since the former is not exposed to sputter etch. The second a-Si layer defines a metallic region of device 400.

Figure 6F:
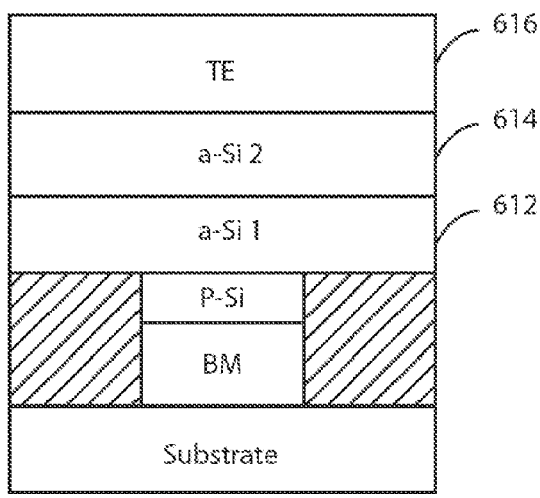

Referring to FIG. 6F, a filament-forming-ion-supplying metal layer 616 is formed over the second a-Si layer. In the present embodiment, metal layer 616 includes silver. In other embodiments, metal layer 616 may include gold (Au), nickel (Ni), aluminum (Al), chromium (Cr), iron (Fe), manganese (Mn), tungsten (W), vanadium (V) and cobalt (Co). Palladium (Pd) may be deposited over silver layer 616 as a passivation layer. The metal layer is patterned to form top electrode 406 of device 400 (see FIG. 4). The top electrode extends along a direction (e.g., a vertical direction) to form an angle with the bottom electrode, e.g., 90 degrees. Although not shown, device 400 includes a plurality of top electrodes 406 extending along a first direction and a plurality of bottom electrodes 402 extending along a second direction to define a plurality of intersections. Each intersection defines a two-terminal cell or device 400.

Figure 7A:
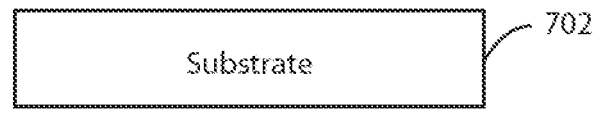
FIGS. 7A-7E illustrate a process for forming a two-terminal memory device having a dual switching layer according to yet another embodiment of the present invention.

FIGS. 7A-7E illustrate a process for forming a device (e.g., device 400) having a dual switching layer according to yet another embodiment of the present invention. A substrate 702 whereon a plurality of devices 400 is to be defined is provided (FIG. 7A). The substrate is a prime grade silicon substrate in the present embodiment. In other embodiments, other semiconductor materials such as III-V and II-VI type semiconductor compounds may be used as the substrate. Device 400 may be formed as part of a front-end process or a back-end process depending on implementation. Accordingly, substrate 702 may include one or more layers of material formed and patterned thereon when the substrate is provided for the present process.

Figure 7B:
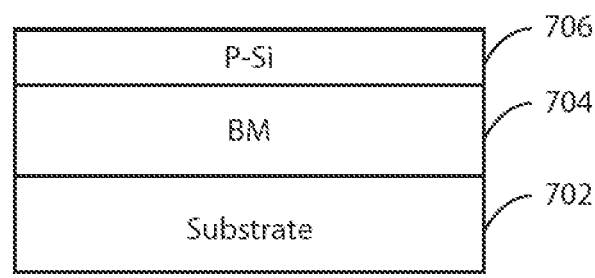

A bottom metal layer 704 is formed over substrate 702 (FIG. 7B). One purpose of the bottom metal is to minimize the resistance of the bottom electrode to be formed. The bottom metal may not be needed in certain implementations. The bottom metal can be gold (Au), nickel (Ni), aluminum (Al), chromium (Cr), iron (Fe), manganese (Mn), tungsten (W), vanadium (V), cobalt (Co), or platinum (Pt). The bottom metal preferably should comprise metal having a high voltage threshold for ion migration (at least higher than that of the metal used for the top electrode).

A polysilicon layer 706 is formed over bottom metal layer 704 to define the bottom electrode having the bottom metal and the polysilicon layer (FIG. 7B). The polysilicon is a p-type and has high doping concentration of $10E17 \sim 10E21/cm^3$ in the present embodiment. Polysilicon 706 may be doped with acceptors such as Boron (B) or Aluminum (Al).

P-type polysilicon 706 may be formed using CVD or LPCVD, or the like. P-type polysilicon 706 facilitates the defect site formation in the a-Si switching medium to be formed in a controlled manner, so that the defect density in the filament region does not become too high.

Figure 7C:
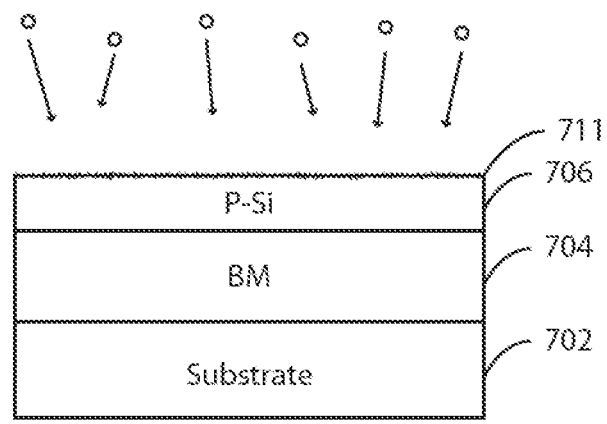

Referring to FIG. 7C, the p-type polysilicon is physically etched to provide its surface with defects or damaged sites (or surface-treated interface) 711. The physical etch can be performed by sputter etch or ion milling. The defect density and the depth of surface-treated interface 711 are controlled by tuning the etch parameters including the bias power, etch time, or the like. In an embodiment, the surface treated interface has a depth of 5-15 nm.

Figure 7D:
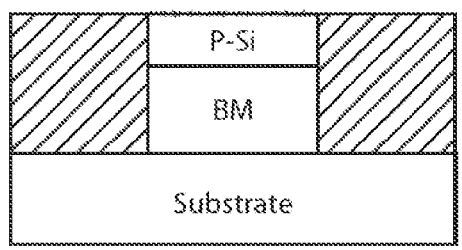

Referring to FIG. 7D, bottom metal 704 and p-type polysilicon 706 are patterned to obtain a bottom electrode 708 extending along a direction (e.g., horizontal direction). Although not shown, a plurality of bottom electrodes 710 extending along the first direction in parallel is formed at this step. An insulating layer 710 is formed over the patterned bottom electrode and then planarized to expose the p-type polysilicon. Insulating layer 710 is silicon dioxide in an embodiment.

Figure 7E:
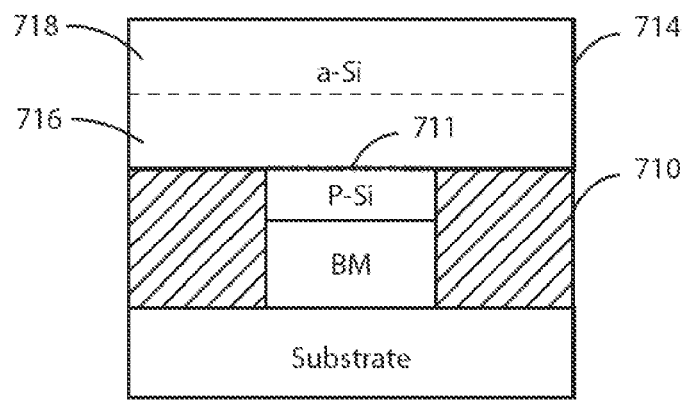

Referring to FIG. 7E, an amorphous silicon layer 714 is formed on the surface-treated interface to a thickness of 20-80 nm according to an embodiment. The amorphous silicon layer is formed using a PECVD, LPCVD, PVD, or other methods described above. As the a-Si layer 714 is being deposited on the surface-treated interface 711, the initial amorphous silicon deposited to 10-15 nm (or first a-Si layer 716) exhibits relatively high defect density since it is being formed directly on the damaged surface of the p-type polysilicon. The amorphous silicon layer deposited thereafter exhibits relatively low defect density compared to the first a-Si layer since the effects of the damaged surface of the p-type polysilicon diminish as more amorphous silicon is deposited thereon. A second a-Si layer 718 is defined by the amorphous silicon layer deposited on the first a-Si layer and has a less defect density than the first a-Si layer.

Figure 7F:
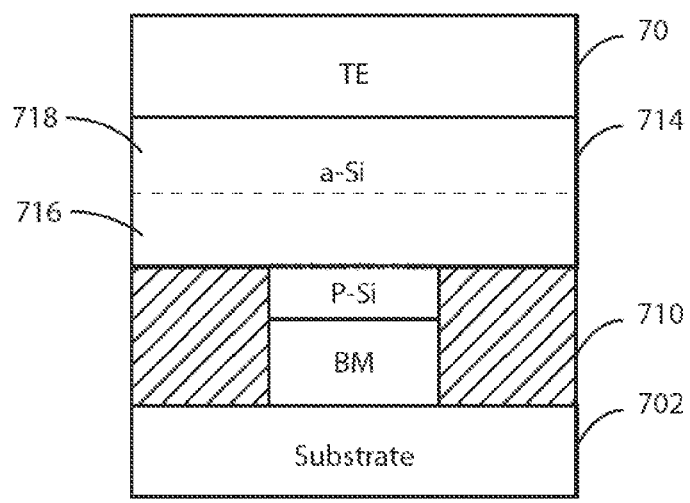

Referring to FIG. 7F, a filament-forming-ion-supplying metal layer 720 is formed over the second a-Si layer. In the present embodiment, metal layer 720 includes silver. In other embodiments, metal layer 720 may include gold (Au), nickel (Ni), aluminum (Al), chromium (Cr), iron (Fe), manganese (Mn), tungsten (W), vanadium (V) and cobalt (Co). Palladium (Pd) may be deposited over silver layer 720 as a passivation layer. The metal layer is patterned to form top electrode 406 of device 400. The top electrode extends along a direction (e.g., a vertical direction) to form an angle with the bottom electrode, e.g., 90 degrees. Although not shown, device 400 includes a plurality of top electrodes 406 extending along a first direction and a plurality of bottom electrodes 402 extending along a second direction to define a plurality of intersections. Each intersection defines a cell or device 400.

Figure 8:
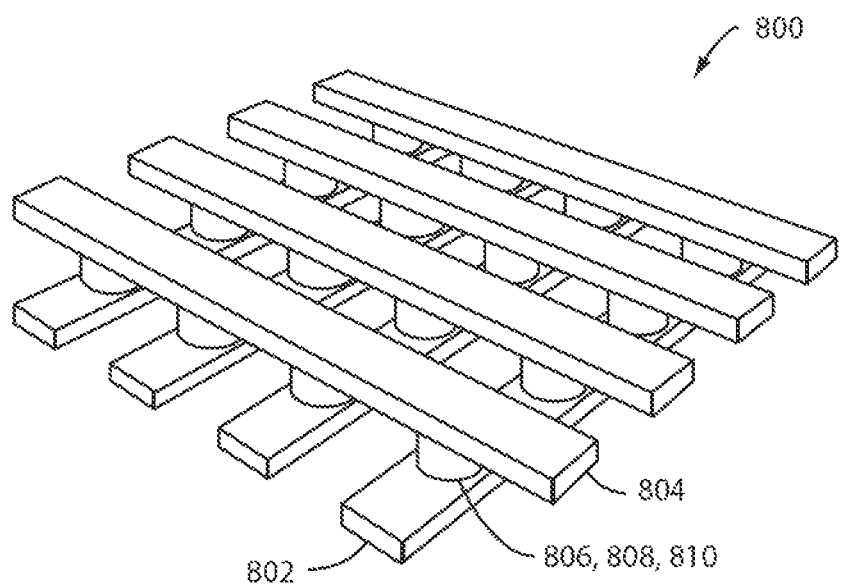
FIG. 8 illustrates a non-crystalline or amorphous silicon (a-Si) based crossbar memory array according to an embodiment of the present invention.

FIG. 8 illustrates a non-crystalline or amorphous silicon (a-Si) based crossbar memory array 800 according to an embodiment of the present invention. The crossbar memory includes a parallel array of bottom electrodes 802 extending along a first direction. In an embodiment, bottom electrodes 802 includes a bottom metal (not shown) and a p-type polysilicon (not shown) formed on the bottom metal. The bottom electrodes are nanoscale in the present embodiment. For example, the bottom electrodes have a width of about 40 nm and pitch of about 60 nm.

A parallel array of top electrodes 804 extends along a second direction to intersect the bottom electrodes. The top electrodes include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes and the bottom electrodes are orthogonal to each other. The top electrodes are nanowires having a width of about 60 nm and a pitch of about 150 nm.

Each intersection 806 of the two arrays defines a two-terminal resistive memory cell 808. One example of cell 808 is the two-terminal device 400 shown in FIG. 4. The memory cell at each intersection 806 includes two electrodes separated by a switching layer 810. In the present embodiment, the switching layer includes amorphous silicon or other non-crystalline silicon. The switching structure can be the same width or narrower than the bottom electrode. In some embodiments, each memory cell in a crossbar memory array can store a single bit. In other embodiments, the memory cells exhibit multi-level resistance thereby allowing storage of a plurality of bits at each cell.

The crossbar memory array as described above may be fabricated on a silicon substrate in an embodiment. In another embodiment, III-V type semiconductor compounds (such as Gallium Arsenide GaAs, Gallium Nitride GaN, Boron Nitride BN etc.) or II-VI type semiconductor compounds (such as Cadmium Selenide, Zinc Telluride etc.) may also be used as the substrate.

A number of embodiments have been described. Nevertheless, it will be understood that various modifications may be made without departing from the spirit and scope of the invention. For example, the ordering of layers on the substrate could be reversed, where the top electrode is provided below the bottom electrode depending on implementation. Accordingly the terms "top" and "bottom" should not be used to limit the relative positions of the source electrode that provides the filament-forming ions in the a-Si structure and an electrode provided at its opposing side.

In addition, it will be understood by those skilled in the art that a switching layer having different defect densities can be obtained many different ways in addition to the methods disclosed above. For example, the switching layer having a higher defect density at the filament region may be obtained by depositing a thin metal layer on the p-type polysilicon and then annealing it prior to forming an amorphous silicon switching layer. Yet another way to form a switching layer having a higher defect density at the filament region would be to co-sputtering metal and silicon on the p-type polysilicon layer prior to forming the amorphous silicon. Accordingly, other embodiments are within the scope of the following claims.

What is claimed is:

1. A memory device having a crossbar array, the memory device comprising:
   a first array of first electrodes extending along a first direction;
   a second array of second electrodes extending along a second direction;
   a non-crystalline silicon structure provided between the first electrode and the second electrode at an intersection defined by the first array and the second array, the non-crystalline silicon structure having a first layer having a first defect density and a second layer having a second defect density different from the first defect density, wherein each intersection of the first array and the second array defines a two-terminal resistive memory cell.

2. The memory device of claim 1, wherein the non-crystalline silicon structure includes amorphous silicon.

3. The memory device of claim 1, wherein the first array of the first electrodes are provided over the non-crystalline silicon structure, and the second array of the second electrodes are provided below the non-crystalline silicon structure, and wherein the first array of the first electrodes include silver, the non-crystalline silicon structure includes amorphous silicon, and the second array of the second electrodes include p-type polysilicon.

4. The memory device of claim 3, wherein each of the first and second layers of the non-crystalline structure includes amorphous silicon, the second layer proximate to the second electrode having a greater defect density than the first layer distal from the second electrode to facilitate formation of a filament therein.

5. The memory device of claim 4, wherein the first and second layers comprise substantially the same material.

6. The memory device of claim 4, wherein the first layer has a thickness of no more than 80 nm and the second layer has a thickness of no more than 15 nm.

7. The memory device of claim 4, wherein metal particles are provided at an interface between the second layer and the second electrode.

8. The memory device of claim 1, wherein the second electrodes include a p-type polysilicon contacting the non-crystalline silicon structure and a bottom metal layer provided below the p-type polysilicon.

9. The memory device of claim 1, wherein the two-terminal resistive memory cell is configured to turn ON when a program voltage is applied to the first electrode and turn OFF when an erase voltage is applied to the first electrode, and wherein the two-terminal resistive memory cell is a memory cell that uses a switching medium whose resistance can be controlled by applying electrical signal without ferroelectricity, magnetization and phase change of the switching medium.

10. The memory device of claim 9, wherein the program voltage is 2 to 4 volts and the erase voltage is −2 to −4 volts.

11. The memory device of claim 9, wherein the two-terminal resistive memory cell has a resistance of at least 10E7 Ohm when in an OFF state.

12. The memory device of claim 9, wherein the two-terminal resistive memory cell behaves like a resistor when turned ON and a capacitor when turned OFF.

13. A resistive memory device, comprising:
a first electrode;
a second electrode;
a non-crystalline silicon structure provided between the first electrode and the second electrode, the non-crystalline silicon structure having a first layer having a first defect density and a second layer having a second defect density different from the first defect density, wherein the first electrode, second electrode and non-crystalline silicon structure define a two-terminal resistive memory cell.

14. The resistive memory device of claim 13, wherein the non-crystalline silicon structure includes amorphous silicon.

15. The resistive memory device of claim 13, wherein the first electrode includes silver, the non-crystalline silicon structure includes amorphous silicon, and the second electrode includes p-type polysilicon.

16. The memory device of claim 15, wherein each of the first and second layers of the non-crystalline structure includes amorphous silicon, the second layer proximate to the second electrode having a greater defect density than the first layer distal from the second electrode to facilitate formation of a filament therein.

17. The memory device of claim 15, wherein the first and second layers comprise substantially the same material, and wherein the first layer has a thickness of no more than 80 nm and the second layer has a thickness of no more than 15 nm.

18. The memory device of claim 15, wherein metal particles are provided at an interface between the second layer and the second electrode.

19. The memory device of claim 13, wherein the two-terminal resistive memory cell is configured to turn ON when a program voltage is applied to the first electrode and turn OFF when an erase voltage is applied to the first electrode, and wherein the two-terminal resistive memory cell behaves like a resistor when turned ON and a capacitor when turned OFF, and wherein the two-terminal resistive memory cell is a memory cell that uses a switching medium whose resistance is changed without ferroelectricity, magnetization and phase change of the switching medium, the non-crystalline silicon structure being the switching medium.

\* \* \* \* \*